(12) United States Patent
Chen et al.

(10) Patent No.: US 7,494,857 B2
(45) Date of Patent: Feb. 24, 2009

(54) ADVANCED ACTIVATION APPROACH FOR MOS DEVICES

(75) Inventors: Chien-Hao Chen, Chuangwei Township (TW); Tze-Liang Lee, Hsinchu (TW); Shih-Chang Chen, Hsin-Chu (TW); Keh-Chiang Ku, Sindan (TW); Chun-Feng Nieh, Baoshan Township (TW); Li-Ting Wang, Tainan (TW); Hsun Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 54 days.

(21) Appl. No.: 11/648,371

(22) Filed: Dec. 29, 2006

(65) Prior Publication Data
US 2008/0160709 A1     Jul. 3, 2008

(51) Int. Cl.
*H01L 21/336* (2006.01)
*H01L 21/461* (2006.01)

(52) U.S. Cl. .................. 438/197; 438/301; 438/689; 257/E21.347

(58) Field of Classification Search ................. 438/197, 438/301, 689; 257/E21.347
See application file for complete search history.

(56) References Cited

U.S. PATENT DOCUMENTS

| | | | |
|---|---|---|---|
| 5,894,150 A * | 4/1999 | Hshieh | 257/335 |
| 6,465,889 B1 * | 10/2002 | Subramanian et al. | 257/760 |
| 6,475,892 B1 * | 11/2002 | Bhakta | 438/585 |
| 2005/0191857 A1 * | 9/2005 | Liu | 438/689 |
| 2006/0269693 A1 * | 11/2006 | Balseanu et al. | 427/569 |
| 2006/0270217 A1 * | 11/2006 | Balseanu et al. | 438/653 |

* cited by examiner

*Primary Examiner*—Walter L Lindsay, Jr.
*Assistant Examiner*—Mohsen Ahmadi
(74) *Attorney, Agent, or Firm*—Slater & Matsil, L.L.P.

(57) ABSTRACT

A method of forming a semiconductor structure includes providing a semiconductor substrate; forming a gate dielectric over the semiconductor substrate; forming a gate electrode on the gate dielectric; forming a source/drain region adjacent the gate dielectric and the gate electrode; forming an absorption-capping layer over the source/drain region and the gate electrode; performing an activation by applying a high-energy light to the absorption-capping layer; and removing the absorption-capping layer.

19 Claims, 7 Drawing Sheets

ADVANCED ACTIVATION APPROACH FOR MOS DEVICES

TECHNICAL FIELD

This invention relates generally to semiconductor devices, and more particularly to manufacturing methods of metal-oxide-semiconductor (MOS) devices, and even more particularly to the activation of source/drain regions.

BACKGROUND

As device dimensions are downscaled, the introduction of high-k dielectric processes causes new challenging issues, for example, the depletion of poly silicon gates. A metal gate process is thus developed to eliminate the poly-gate depletion problem.

As is known in the art, after the formation of source/drain regions, an activation process is needed to activate source/drain regions and gate electrodes. The activation process is typically performed with an annealing step. Recently, annealing methods that require very short periods of time have been increasingly used due to their low thermal budgets. These annealing methods include laser annealing, flash annealing, and the like, in which the wafer is exposed to a high-energy light source for a very short time, for example, several milliseconds or less. During the annealing, the light energy is absorbed by the wafer, so that the wafer temperature is rapidly increased to, for example, 1000° C. or higher. Source/drain regions and gate electrodes are thus activated.

The escalation of the wafer temperature is dependent upon the light-absorbing abilities of the features on the surface of the wafer. It has been found that metal gates have a high reflection rate to lights commonly used in the activation process, and thus the introduction of metal gates into the CMOS process impacts the activation process. Accordingly, light absorption significantly depends on pattern density, leading to significant temperature variations from one region of a wafer to another, and from one wafer to another if the wafers are for different products.

Accordingly, what is needed in the art is a method for reducing the temperature variations in the annealing process and to reduce and/or eliminate the effects of pattern density on temperature uniformity.

SUMMARY OF THE INVENTION

In accordance with one aspect of the present invention, a method of forming a semiconductor structure includes providing a semiconductor substrate; forming a gate dielectric over the semiconductor substrate; forming a gate electrode on the gate dielectric; forming a source/drain region adjacent the gate dielectric and the gate electrode; forming an absorption-capping layer over the source/drain region and the gate electrode; applying a high-energy light to the absorption-capping layer; and removing the absorption-capping layer.

In accordance with another aspect of the present invention, a method of forming a semiconductor structure includes providing a semiconductor substrate; forming a semiconductor device comprising a metal-containing gate electrode; forming an absorption-capping layer having an extinction coefficient greater than about 0.2 over the semiconductor device; applying a high-energy light for a duration of less than ten milliseconds to anneal the semiconductor device; and removing the absorption-capping layer.

The advantageous features of the present invention include smaller temperature variations in a wafer and more predictable activation temperatures for different wafers with different designs.

DESCRIPTION OF THE DRAWINGS

For a more complete understanding of the present invention, and the advantages thereof reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Experiments have been performed to study the effects of patterns on the surface of a wafer. In a first experiment, a blank silicon wafer is exposed to a laser annealing with a wavelength of 810 nm. The surface of the silicon wafer reaches a temperature of about 1032° C. In a second experiment, the silicon wafer includes densely located gate stacks. When exposed to the same laser for the same duration, the surface of the silicon wafer reaches 1173° C. Experiment results have indicated that in the first experiment, the reflection rate is about 44 percent, while in the second experiment, the reflection rate is about 28 percent. The reflection rate of the wafer surface thus plays a role in the resulting wafer temperatures.

Figure 1A:
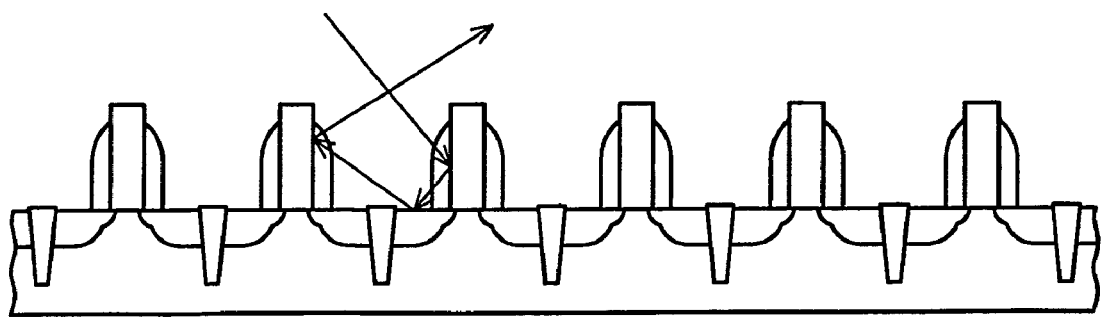
FIGS. 1A, 1B and 1C schematically illustrate light reflection behaviors in response to different pattern densities.
Figure 1B:
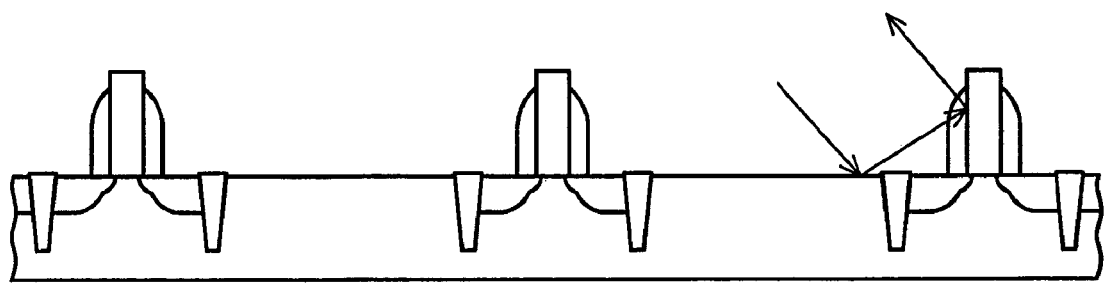
Figure 1C:
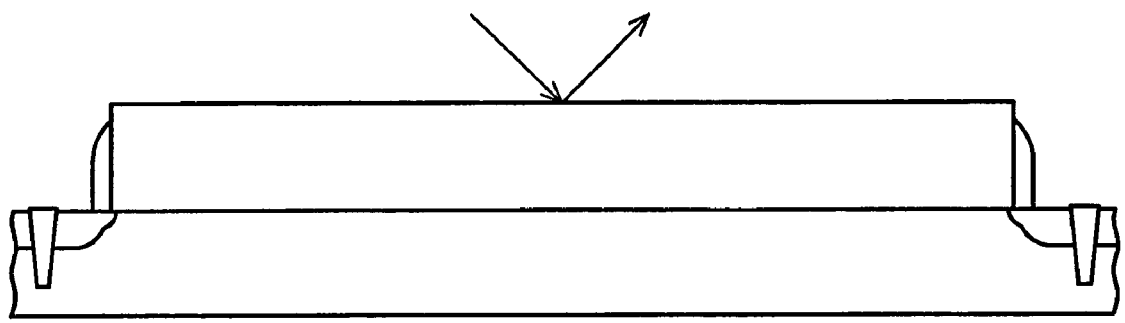

A possible cause of the difference in the temperature is explained using FIGS. 1A, 1B and 1C. In FIG. 1A, a portion of a wafer with densely located gate stacks (thus the wafer is more topographical) is illustrated. A light path is schematically shown. Due to the closely located gate patterns, the light rays, particularly light rays with greater angles, have a greater chance of being reflected between features on the wafers. During each reflection, a certain percentage of the light energy is absorbed, and the rest is reflected. Therefore, with more reflections, there is a greater chance of the light energy being absorbed. FIG. 1B illustrates a portion of a wafer surface having a medium pattern density. FIG. 1B illustrates that the light energy has a lesser chance of being absorbed than in FIG. 1A. FIG. 1C illustrates a portion of a wafer surface with a large gate, thus the wafer surface is relatively flat. It is found that a light ray has an even smaller chance of being reflected between features. Furthermore, when formed of metals, the gate has a high reflection rate. Accordingly, the resulting temperatures on the surfaces of the wafers shown in FIGS. 1A, 1B and 1C tend to decrease with the decrease in the pattern density.

It should be appreciated that the annealing temperatures are functions of various factors, such as reflection rate, pattern densities, angles of the light ray, materials of the surface features, etc. Therefore, it is thus difficult to achieve a uniform annealing temperature by adjusting each of these factors. The preferred embodiments of the present invention provide a simple method to solve this problem. The intermediate stages of a preferred embodiment of the present invention are illustrated in FIGS. 2 through 5. Throughout the various views and illustrative embodiments of the present invention, like reference numbers are used to designate like elements.

Figure 2:
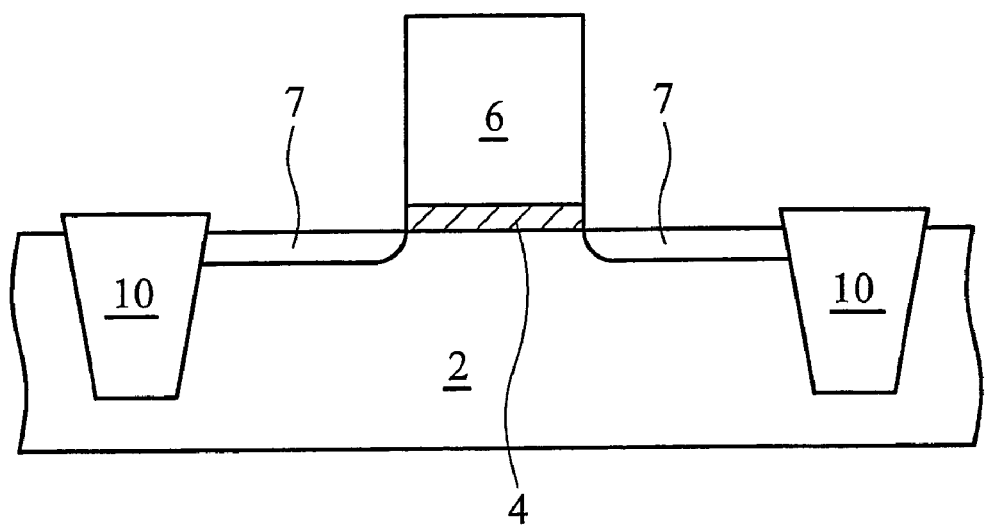
FIGS. 2 through 5 are cross-sectional views of intermediate stages in the manufacture of a MOS transistor embodiment.

FIG. 2 illustrates the formation of shallow trench isolations (STIs) 10 in substrate 2. In the preferred embodiment, substrate 2 is a silicon substrate. In other embodiments, bulk semiconductor, strained semiconductor, compound semiconductor, multi-layer semiconductor, silicon on insulator (SOI), and the like, can be used. STIs 10 are preferably formed by etching shallow trenches in substrate 2 and filling the trenches with an insulator such as high-density plasma (HDP) oxide.

A gate dielectric 4 is deposited on the surface of substrate 2. In one embodiment, gate dielectric 4 comprises oxides, which may be formed by known methods, such as thermal oxidation, local oxidation of silicon (LOCOS), chemical vapor deposition (CVD), and the like. Silicon nitride can also be used since it is an effective barrier to impurity diffusion. The silicon nitride film is preferably formed by thermal nitridation of silicon. It can also be prepared by plasma anodic nitridation using nitrogen-hydrogen. Gate dielectric 4 may also comprise other materials such as oxynitrides, oxygen-containing dielectrics, nitrogen-containing dielectrics, high-k materials, and combinations thereof.

A gate electrode 6 is formed on gate dielectric 4. The gate electrode 6 preferably comprises metal-containing materials, such as metals, metal silicides, and metal nitrides, although it may be formed of other materials such as polysilicon. The preferred formation methods include physical vapor deposition (PVD) and CVD. Preferably, gate electrode 6 and gate dielectric 4 are formed by blanket depositing a gate electrode layer on a gate dielectric layer, and then patterning the gate electrode layer and the gate dielectric layer.

Lightly doped source/drain (LDD) regions 7 are then formed. In the preferred embodiment, LDD regions 7 are formed by implanting appropriate dopants, and the type of dopants used depends on the type of MOS device to be formed.

Figure 3:
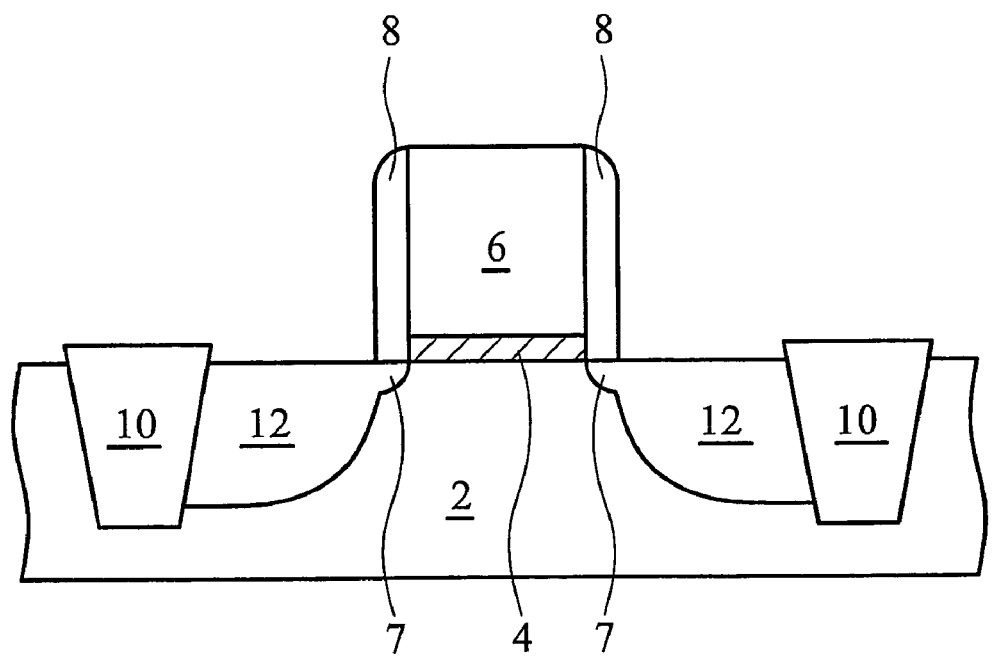

FIG. 3 illustrates the formation of a pair of spacers 8 along the sidewalls of the gate dielectric 4 and gate electrode 6. As is known in the art, spacers 8 are preferably formed by blanket depositing a dielectric layer and anisotropically etching to remove the dielectric layer from horizontal surfaces, thus leaving spacers 8. FIG. 3 illustrates rectangular spacers. In another embodiment, spacers 8 can also be L-shaped, the formation of which is well known in the art.

Source/drain regions 12 may be recessed in or elevated above substrate 2 (using, e.g., epitaxially grown regions). In the preferred embodiment, source/drain regions 12 are formed by implanting impurities into semiconductor substrate 2, and spacers 8 are used as a mask so that the inner edges of source/drain regions 12 are substantially aligned with the respective spacers 8. Gate electrode 6 is also preferably implanted to reduce sheet resistance. In other embodiments, source/drain regions 12 are formed by recessing substrate 2, then epitaxially growing silicon, SiGe, or SiC in the recesses. In yet other embodiments, raised source/drain regions 12 are formed by epitaxially growing silicon, SiGe, or SiC with a desired dopant on the top surface of substrate 2. In an exemplary embodiment for forming raised source/drain regions, a $SiO_2$ film is formed in regions where no source and drain are to be formed. The subsequently grown epitaxial film will be poly-crystalline where formed on the $SiO_2$ film and can be subsequently removed. In the regions where substrate 2 is exposed, a single crystal film is grown.

Figure 4A:
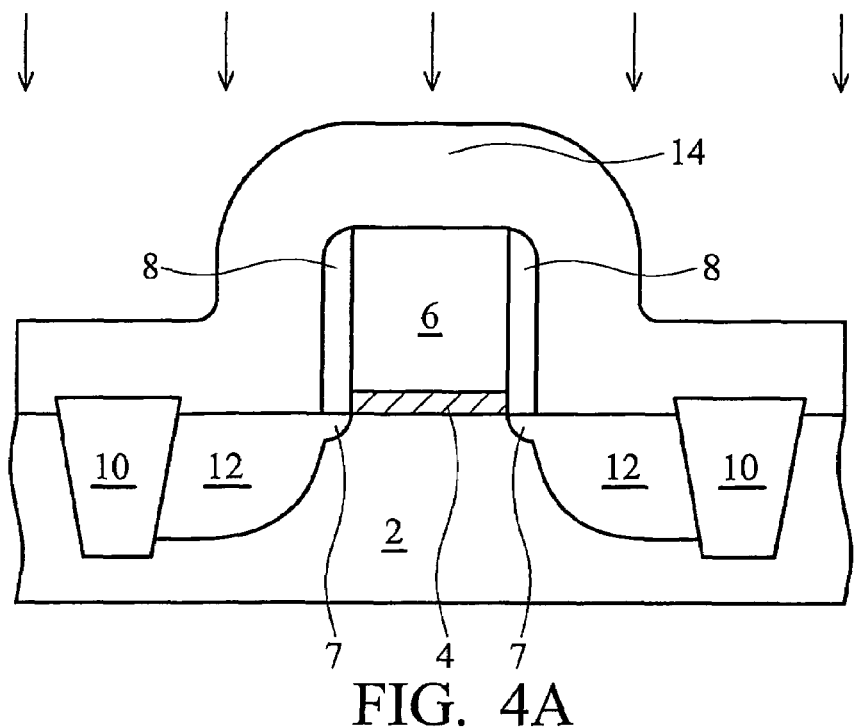

Referring to FIG. 4A, an absorption-capping layer 14 is formed. Absorption-capping layer 14 preferably comprises a material having a high absorption rate, for example, greater than about 50 percent, and more preferably greater than about 80 percent for the energy source used for the subsequent activation process. In the preferred embodiment, absorption-capping layer 14 has a high extinction coefficient, preferably greater than about 0.2, and more preferably greater than about 0.3. It should be appreciated that the absorption rates and extinction coefficients are functions of wavelengths, and the above-referenced values are preferably determined based on the wavelengths of the specific lights to be used for the activation process.

The preferred materials of the absorption-capping layer 14 include amorphous carbon, amorphous silicon, polysilicon, SiC, SiGe, and combinations thereof. The preferred formation methods include plasma enhanced chemical vapor deposition (PECVD), atomic layer deposition (ALD) and other commonly used methods. Absorption-capping layer 14 preferably has a thickness of between about 10 nm and about 2000 nm.

Figure 4B:
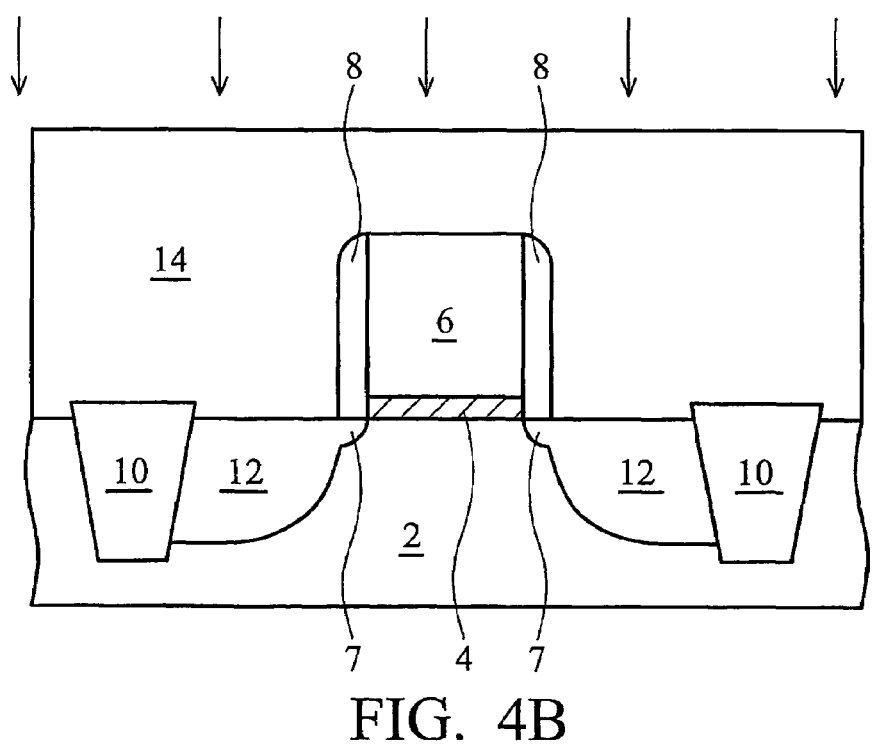
Figure 4C:
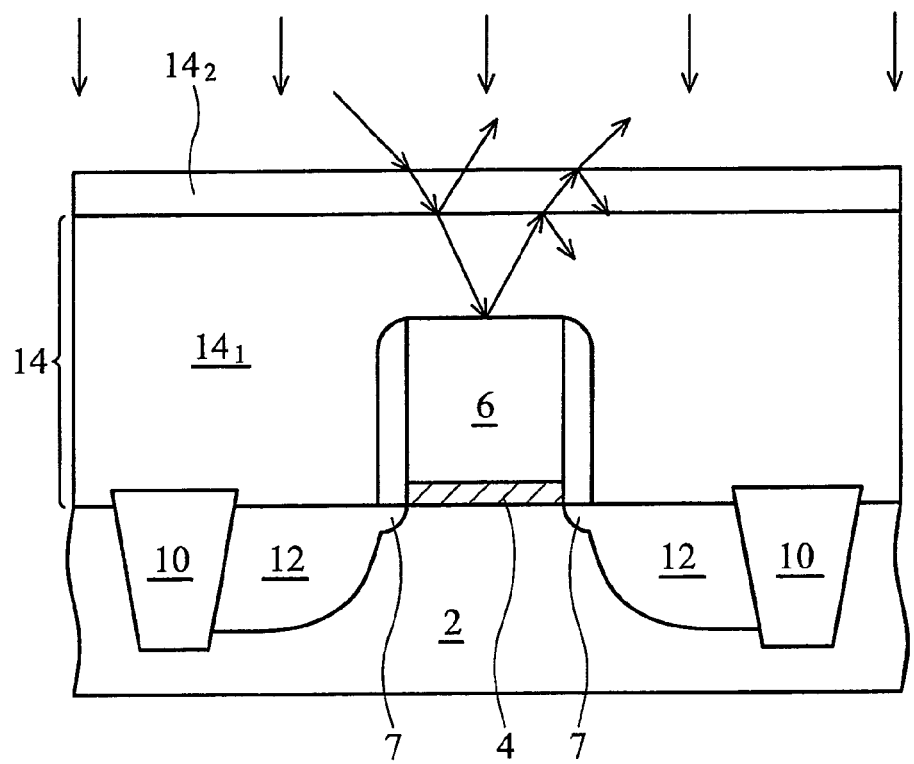

FIG. 4B illustrates a more preferred embodiment wherein absorption-capping layer 14 is thicker than the height of the gate stack. Optionally, a chemical mechanical polish (CMP) is performed to level the top surface of absorption-capping layer 14. Alternatively, depending on the material of absorption-capping layer 14, a re-flow process may be performed to level its top surface. Absorption-capping layer 14 may be a single layer or may include more than one layer. For example, FIG. 4C illustrates an absorption-capping layer 14 comprising two layers $14_1$, and $14_2$ formed of different materials. In an exemplary embodiment, layer $14_2$ has a refractive index less than a refractive index of layer $14_1$, so that the reflected light rays may have a chance of total internal reflection at the interface of layers $14_1$ and $14_2$. Alternatively, layer $14_2$ has a refractive index greater than a refractive index of layer $14_1$. In yet other embodiments, layer $14_1$ and layer $14_2$ comprise similar materials, but are formed using different methods and/or different process conditions. For example, one of the layers $14_1$ and $14_2$ comprises amorphous silicon, while the other layer comprises polysilicon.

Figure 4D:
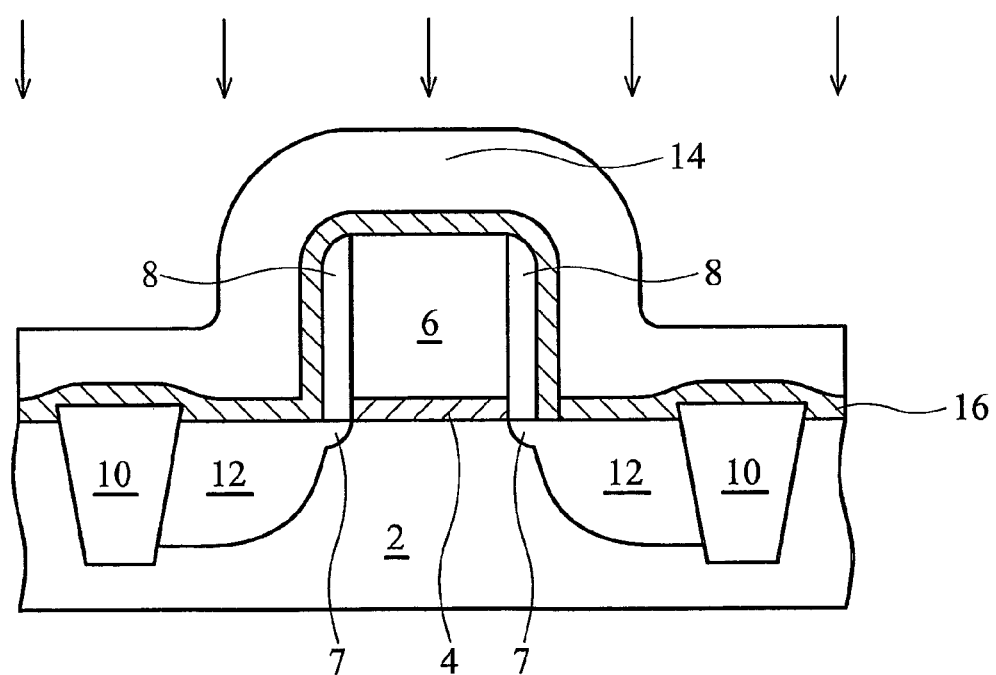
Figure 4E:
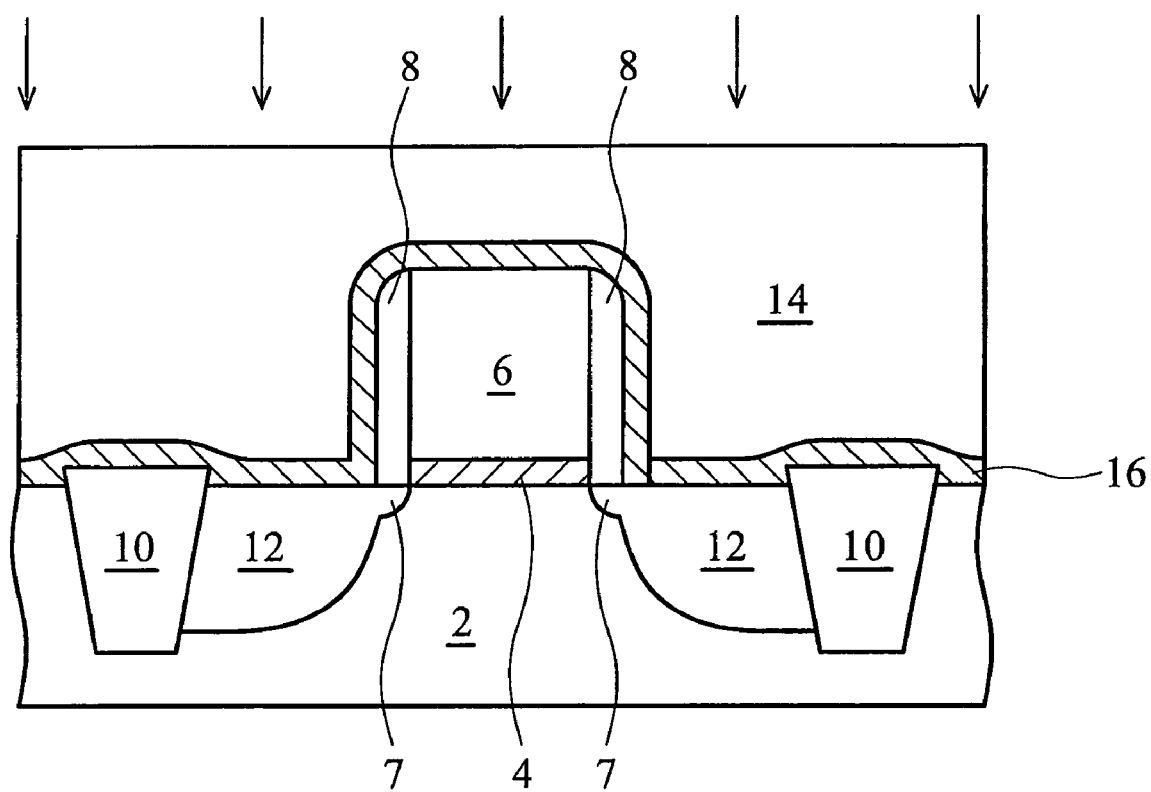

Since absorption-capping layer 14 will be removed in subsequent processes, an etch stop layer (ESL) 16 is preferably formed, as illustrated in FIGS. 4D and 4E. ESL 16 is preferably formed of oxides, nitrides, oxynitrides, and combinations thereof. With ESL 16, absorption-capping layer 14 can be formed of similar materials as the underlying structures, for example, amorphous silicon or polysilicon. Furthermore, with ESL 16, a thick absorption-capping layer 14 can be formed, so that when absorption-capping layer 14 is removed subsequently, the underlying structures, for example, the source/drain regions 12, are less likely to be damaged.

As symbolized by arrows in FIGS. 4A through 4E, source/drain regions 12, LDD regions 7, and gate electrode 6 are activated by an annealing, in which the wafer is exposed to a high-energy light source, which has the ability to generate lights having short wavelengths, for example, between about 10 nm and about 1 um. The preferred annealing methods include laser annealing, flash annealing, and the like, and the high-energy light sources include commonly used light sources for these methods. The annealing may be performed for a very short duration, for example, within ten milliseconds or less. The energy applied by the energy source is absorbed by absorption-capping layer 14, causing a rapid increase in temperature, for example, to about 1000° C. or higher. Heat is then conducted to the underlying source/drain regions and gate electrodes to activate them. Since absorption-capping layer 14 has a high absorption rate, less energy is reflected. Accordingly, the temperature variation in a wafer is less sensitive to topographical change and/or material change. In addition, the resulting temperature depends to a great extent on the absorption-capping layer 14, which is substantially uniform across the wafer. As a result, a more uniform temperature across the wafer can be achieved. Since temperatures are greatly affected by the absorption-capping layer 14 instead of the underlying structures, when the absorption-capping layer 14 is formed on wafers of different products, the temperatures have smaller variations, thus are more predictable.

Besides the annealing step performed using the high-energy light source, an additional annealing step, such as furnace annealing and rapid thermal annealing (RTA) may be performed to assist the activation process.

Figure 5:
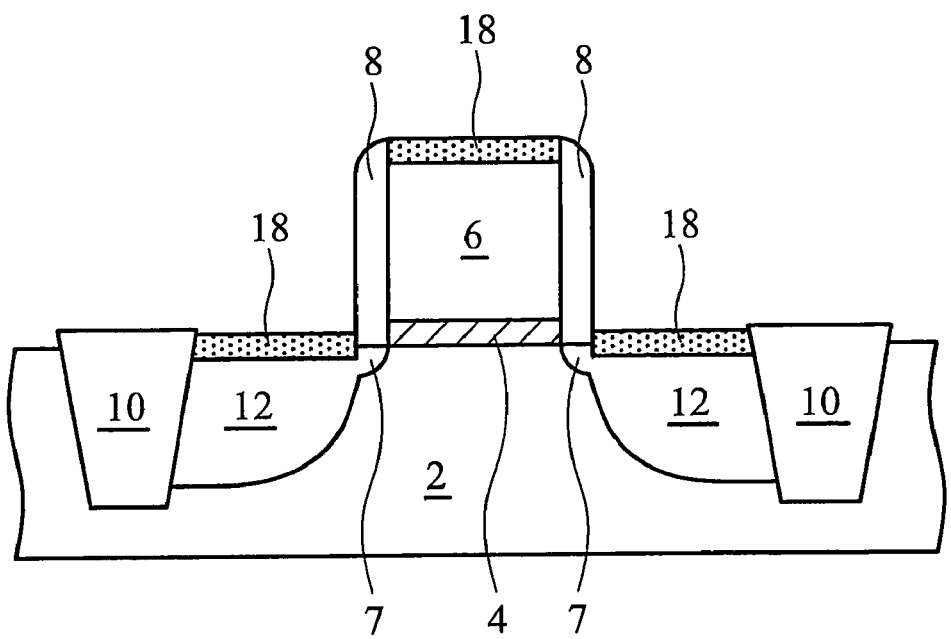

As illustrated in FIG. 5, after the activation, absorption-capping layer 14 and ESL 16 are removed, and silicide regions 18 are formed on source/drain regions 12, and possibly on gate electrode 6 if it is formed of polysilicon. The silicide regions 18 preferably include $NiSi_2$, $CoSi_2$, $TiSi_2$ or the like. As is known in the art, to form a silicide layer, a metal layer is formed by blanket depositing a thin layer of metal, such as cobalt, nickel, titanium, and the like. The wafer is then annealed to form a silicide between the deposited metal and the underlying exposed silicon regions. Un-reacted metal is then removed.

Figure 6:
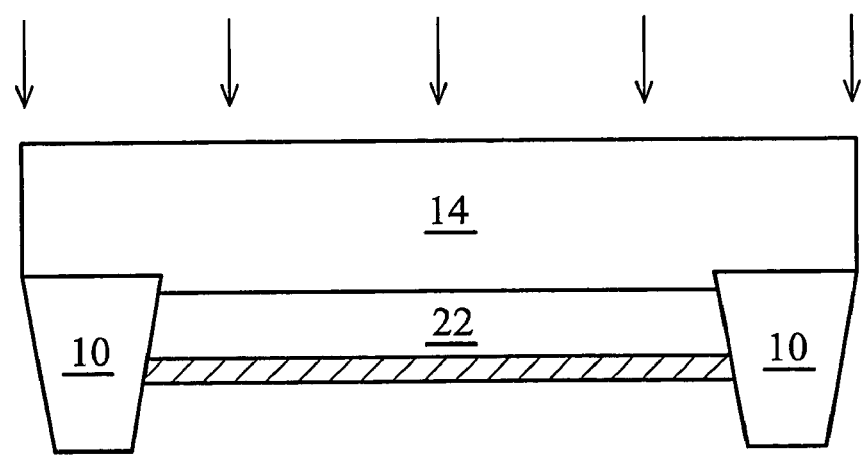
FIG. 6 illustrates an activation of a resistor.

It should be appreciated that although the preferred embodiment of the present invention illustrates an activation process of a MOS device, the concept of the present invention is readily applied to the annealing steps of other semiconductor devices in which high-energy light sources are needed. FIG. 6 illustrates an exemplary formation of a resistor 22, which is a doped semiconductor strip. The impurities in resistor 22 are activated to improve conductivity. The activation of resistor 22 may also be performed using the same method by forming an absorption-capping layer 14 and applying a high-energy light.

The preferred embodiments of the present invention have several advantageous features. By forming an absorption-capping layer, the rate of absorption of the energy applied to the wafer is less affected by the surface conditions of the wafer. Not only is a more uniform activation temperature achieved on a same wafer, the temperature variations for wafers having different designs are also reduced. The activation process of the present invention is substantially independent from wafer surface conditions, thus is simple to perform.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
   providing a semiconductor substrate;
   forming a gate dielectric over the semiconductor substrate;
   forming a gate electrode on the gate dielectric;
   forming a source/drain region adjacent the gate dielectric and the gate electrode;
   forming an absorption-capping layer over the source/drain region and the gate electrode,
   wherein the absorption-capping layer comprises a material selected from the group consisting essentially of amorphous carbon, amorphous silicon, poly silicon, SiC, SiGe, and combinations thereof, and
   wherein the absorption-capping layer has an extinction coefficient of greater than about 0.2, and absorption rate of greater than about 50 percent;
   applying a high-energy light to the absorption-capping layer; and
   removing the absorption-capping layer.

2. The method of claim 1, wherein the absorption-capping layer has an extinction coefficient of greater than about 0.3.

3. The method of claim 1, wherein the absorption-capping layer has an absorption rate of greater than about 80 percent.

4. The method of claim 1, wherein the absorption-capping layer has a substantially flat top surface.

5. The method of claim 1, wherein the absorption-capping layer is a composite layer.

6. The method of claim 5, wherein the step of forming the absorption-capping layer comprises forming a first layer and a second layer on the first layer, wherein the first and the second layers comprise different materials.

7. The method of claim 6, wherein the second layer has a lower refractive index than the first layer.

8. The method of claim 1, wherein the step of applying the high-energy light comprises flash annealing.

9. The method of claim 1, wherein the high-energy light is applied for less than about 10 milliseconds.

10. The method of claim 1 further comprising forming silicide regions after the step of removing the absorption-capping layer.

11. The method of claim 1 further comprising forming an etch stop layer before the step of forming the absorption-capping layer, wherein the etch stop layer is removed after the step of applying the high-energy light.

12. The method of claim 1, wherein the gate electrode comprises a metal.

13. A method of forming a semiconductor structure, the method comprising:
   providing a semiconductor substrate;
   forming a semiconductor device comprising a metal-containing gate electrode;
   forming an absorption-capping layer having an extinction coefficient greater than about 0.2 over the semiconductor device;
   applying a high-energy light for a duration of less than ten milliseconds to anneal the semiconductor device; and
   removing the absorption-capping layer.

14. The method of claim 13, wherein the step of forming the absorption-capping layer comprises forming a first layer and a second layer on the first layer, wherein the second layer has a lower refractive index than the first layer.

15. The method of claim 13 further comprising forming an etch stop layer before the step of forming the absorption-capping layer, wherein the etch stop layer is removed after the step of applying the high-energy light.

16. The method of claim 15, wherein the etch stop layer comprises a material selected from the group consisting essentially of oxides, nitrides, oxynitrides, and combinations thereof.

17. The method of claim 13, wherein the high-energy light has a wavelength of between about 10 nm and about 1 um.

18. The method of claim 13 further comprising leveling a top surface of the absorption-capping layer before the step of applying the high-energy light.

19. The method of claim 13, wherein the absorption-capping layer comprises a material selected from the group consisting essentially of amorphous carbon, amorphous silicon, polysilicon, SiC, SiGe, and combinations thereof.

* * * * *